United States Patent
Nagarad et al.

(10) Patent No.: US 8,283,263 B2
(45) Date of Patent: Oct. 9, 2012

(54) INTEGRATED CIRCUIT SYSTEM INCLUDING NITRIDE LAYER TECHNOLOGY

(75) Inventors: Sripad Sheshagiri Nagarad, Singapore (SG); Hwa Weng Koh, Singapore (SG); Dong Kyun Sohn, Singapore (SG); Xiaoyu Chen, Singapore (SG); Louis Lim, Singapore (SG); Sung Mun Jung, Singapore (SG); Chiew Wah Yap, Singapore (SG); Pradeep Ramachandramurthy Yelehanka, Singapore (SG); Nitin Kamat, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 40 days.

(21) Appl. No.: 11/428,618

(22) Filed: Jul. 5, 2006

(65) Prior Publication Data

US 2008/0032513 A1  Feb. 7, 2008

(51) Int. Cl.
*H01L 21/469* (2006.01)

(52) U.S. Cl. .. 438/761; 438/763; 438/791; 257/E21.267

(58) Field of Classification Search ............. 438/791, 438/792, 761, 763; 257/E21.267
See application file for complete search history.

(56) References Cited

U.S. PATENT DOCUMENTS

| | | | | |
|---|---|---|---|---|
| 5,756,404 A | * | 5/1998 | Friedenreich et al. | 438/791 |
| 5,981,404 A | * | 11/1999 | Sheng et al. | 438/791 |
| 6,121,116 A | | 9/2000 | Sung | |
| 6,465,373 B1 | * | 10/2002 | Zheng et al. | 438/794 |
| 6,790,755 B2 | | 9/2004 | Jeon | |
| 6,797,650 B1 | | 9/2004 | Wang et al. | |
| 6,812,515 B2 | * | 11/2004 | Rabkin et al. | 257/315 |
| 6,946,349 B1 | | 9/2005 | Lee et al. | |
| 7,300,885 B2 | * | 11/2007 | Hasebe et al. | 438/758 |
| 2004/0046212 A1 | | 3/2004 | Takahashi | |
| 2005/0227437 A1 | | 10/2005 | Dong et al. | |

* cited by examiner

*Primary Examiner* — Michael Trinh

(57) ABSTRACT

An integrated circuit method for manufacturing an integrated circuit system including loading a wafer into a processing chamber and pre-purging the processing chamber with a first ammonia gas. Depositing a first nitride layer over the wafer and purging the processing chamber with a second ammonia gas. Depositing a second nitride layer over the first nitride layer that is misaligned with the first nitride layer. Post-purging the processing chamber with a third ammonia gas and purging the processing chamber with a nitrogen gas.

10 Claims, 7 Drawing Sheets

US 8,283,263 B2

INTEGRATED CIRCUIT SYSTEM INCLUDING NITRIDE LAYER TECHNOLOGY

TECHNICAL FIELD

The present invention relates generally to integrated circuit systems, and more particularly to an integrated circuit system including nitride layer technology.

BACKGROUND ART

Process integration for embedded silicon/silicon oxide/silicon nitride/silicon oxide/silicon (SONOS) technology is an area of interest for the electronics industry. Embedded SONOS technology typically includes the formation of input/output (I/O) regions between non-volatile memory regions and core/logic regions. This embedded SONOS arrangement is found in many of today's integrated circuit systems such as, cellphones, portable music players, video cameras, and computers.

Central to many integrated circuit system processes, including SONOS processes, is the formation of a silicon nitride ($Si_3N_4$) layer. Silicon nitride is often used as a passivation layer, a mask material, and/or a charge trapping layer. Regardless of its chosen application, the silicon nitride film should display a high film purity and density, uniform stoichiometry, and a uniform thickness. Low pressure chemical vapor deposition (LPCVD) has emerged as the process for depositing silicon nitride films with superior properties.

Despite LPCVD advancements, silicon nitride is still subject to discontinuities such as pinhole formation. These pinhole formations not only affect the integrity of the silicon nitride layers themselves, but they also may affect adjacent layers as well. For instance, during the removal of a silicon oxide/silicon nitride/silicon oxide (ONO) layer, dry etching of the top silicon oxide layer, followed by a wet clean step, may attack the bottom silicon oxide layer through the pinholes within the silicon nitride layer. This erosion of the bottom silicon oxide can lead to silicon substrate pitting during the dry etch of the silicon nitride layer. Pitting of the silicon substrate can lead to gate dielectric failure during subsequent gate dielectric formation.

Thus, a need still remains for the forming of a defect free silicon nitride layer or the processing of a silicon nitride layer without defect formation. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit method for manufacturing an integrated circuit system, which includes loading a wafer into a processing chamber and pre-purging the processing chamber with a first ammonia gas. Depositing a first nitride layer over the wafer and purging the processing chamber with a second ammonia gas. Depositing a second nitride layer over the first nitride layer that is misaligned with the first nitride layer. Post-purging the processing chamber with a third ammonia gas and purging the processing chamber with a nitrogen gas.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
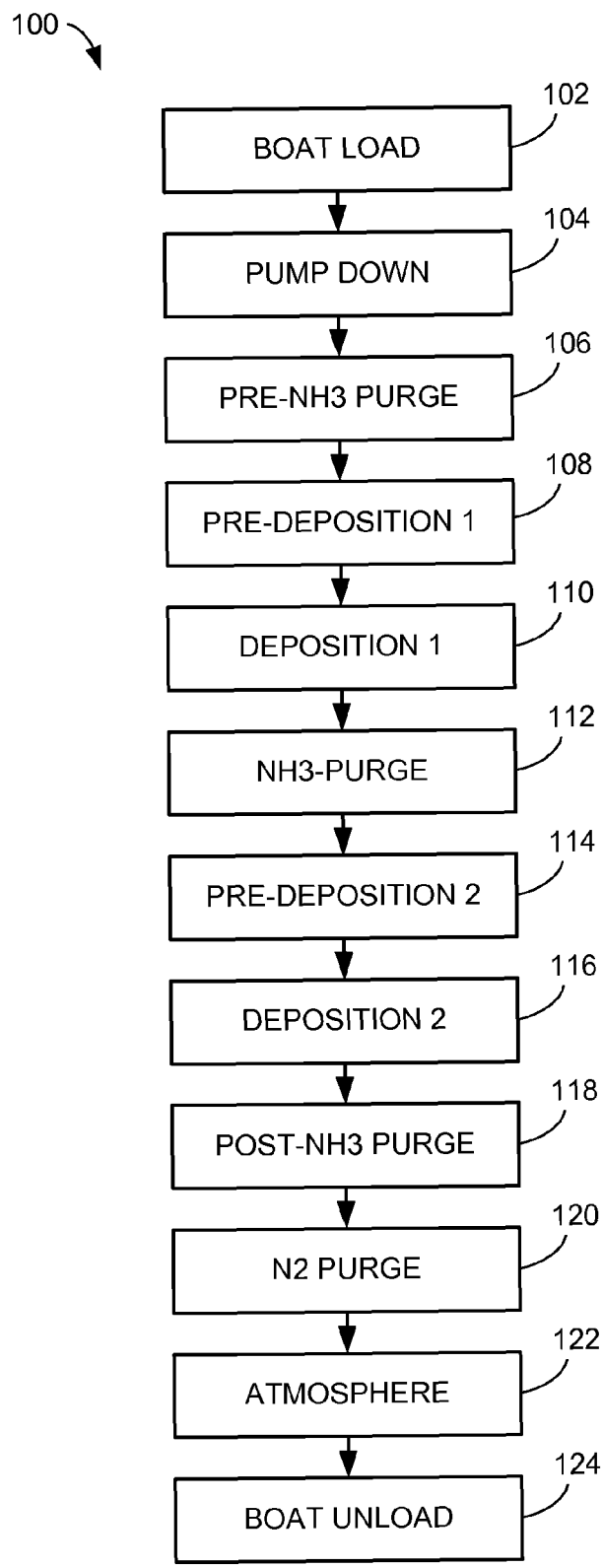
FIG. 1 is a generalized process overview for the formation of a nitride layer in an integrated circuit system in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of a wafer or substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a generalized process overview for the formation of a nitride layer in an integrated circuit system 100 in accordance with an embodiment of the present invention. Per this embodiment, a silicon nitride layer is formed by multiple separate deposition steps, which causes the microscopic discontinuities (i.e.—pinholes) formed within each layer, to misalign and thereby reduce the incidence of damage to the bottom silicon oxide layer during the top silicon oxide etching process. Although the silicon nitride layer formed by this embodiment is comprised by multiple separate deposition steps, the silicon nitride layer still functions as a single silicon nitride layer with a sufficient thickness to perform the intended design operation.

Additionally, it is to be understood that the silicon nitride layer formed by this process may be employed in any capacity regarding semiconductor manufacturing. For instance, the silicon nitride layer formed by this process may act as a stand alone layer (e.g.—a passivation or insulation layer) or may be part of a composition (e.g.—a charge trapping layer), such as a silicon oxide/silicon nitride/silicon oxide (ONO) layer or a silicon oxide/silicon nitride/silicon oxide/silicon nitride (ONON) layer. Furthermore, each nitride layer of the ONON configuration can be formed by the multiple separate deposition steps described above and in further detail below.

The following is provided as an exemplary illustration for the formation of a silicon nitride layer by multiple separate deposition steps and it is not to be construed as limiting.

Initially a wafer boat, with one or more wafers, is loaded into a processing chamber, such as an LPCVD chamber, in a block 102. By way of example, the LPCVD chamber may include hot-wall reactors, cold-wall reactors, and multi-chamber cluster tools that operate at a medium vacuum (about 0.1 to about 5 torr), and employ temperatures between about 300 and 900° C. The wafer boat is typically made of an amorphous quartz that is resistant to high temperatures. The wafer boat may be loaded by a manual or automated process.

After loading the wafer boat, the LPCVD chamber is sealed and pumped down to its desired operating pressure in a block 104. By way of example, the desired operating pressure may range from about 0.2 to about 0.5 torr. However, in accordance with the scope of this invention, it is to be understood that the desired operating pressure may be any pressure that is effective to form a silicon nitride layer.

During pump down, the temperature is also ramped up to its desired operating temperature. By way of example, the desired operating temperature may range from about 650 to about 775° C. However, it is to be understood that the desired operating temperature may be any temperature that is effective to form a silicon nitride layer.

After pump down, the LPCVD chamber is pre-purged by a first ammonia ($NH_3$) gas in a block 106. By way of example, the flow rate of the first ammonia gas may range from about 100 to about 500 sccm and may continue for about 10 minutes. However, it is to be understood that the flow rates and the duration of flow can be set at any values that are effective to form a silicon nitride layer.

Following the ammonia pre-purge, a pre-deposition step one occurs in a block 108. The pre-deposition step one includes ramping up the flow rates of first source gases, such as dichlorosilane (DCS) and ammonia gas, to their operating ranges to begin the initial formation of the first silicon nitride layer over the wafers surface. By way of example, the pre-deposition step one cycle may last for about 30 seconds.

Once the flow rate operating ranges for the first source gases are obtained, then deposition step one occurs in a block 110. As an exemplary illustration, the flow rates for the first source gases may range from about 20 to about 200 sccm for DCS and from about 100 to about 500 sccm for ammonia. However, it is to be understood that the present invention may employ any flow rate ranges for the first source gases that effectively forms a first silicon nitride layer.

Deposition step one forms the first silicon nitride layer over the wafers surface. Notably, deposition step one forms the first silicon nitride layer over the wafers surface to any thickness less than the final silicon nitride layer. As an exemplary illustration, the first silicon nitride layer may be deposited to a thickness of about 20 percent of the total thickness of the final silicon nitride layer.

By way of example, deposition step one may employ a temperature range of about 650 to about 775° C. and a pressure operating range of about 0.2 to about 0.5 torr. However, it is to be understood that deposition step one may employ any temperature or pressure range that is effective to form the first silicon nitride layer.

After the appropriate thickness of the first silicon nitride layer is deposited by deposition step one, then the LPCVD chamber is purged with a second ammonia gas in a block 112. By way of example, the second ammonia gas may employ a flow rate ranging from about 100 to about 500 sccm. However, it is to be understood that the present invention may employ any flow rate range for the second ammonia gas that effectively purges the LPCVD chamber.

Following the ammonia purge, a pre-deposition step two occurs in a block 114. The pre-deposition step two includes ramping up the flow rates of second source gases, such as dichlorosilane (DCS) and ammonia gas, to their desired operating ranges to begin formation of the second silicon nitride layer, which is formed over or directly on the first silicon nitride layer. By way of example, the pre-deposition step two cycle may last for about 30 seconds.

Once the flow rate operating ranges for the second source gases are obtained, then deposition step two occurs in a block 116. As an exemplary illustration, the flow rates for the second source gases may range from about 20 to about 200 sccm for DCS and from about 100 to about 500 sccm for ammonia. However, it is to be understood that the present invention may employ any flow rate ranges for the second source gases that effectively forms a second silicon nitride layer.

By way of example, deposition step two may employ a temperature range of about 650 to about 775° C. and a pressure operating range of about 0.2 to about 0.5 torr. However, it is to be understood that deposition step two may employ any temperature or pressure range that is effective to form the second silicon nitride layer.

Deposition step two forms the second silicon nitride layer misaligned over the first silicon nitride layer. By disrupting the formation of the first silicon nitride layer, purging the chamber and then restarting with the formation of the silicon nitride layer, any defects (e.g.—pinholes) that were forming in the first silicon nitride layer are not continued in the second silicon nitride layer.

Although this embodiment describes a process employing two separate deposition steps, it is to be understood that any number of deposition steps, in excess of one, may be employed when forming the final or overall silicon nitride layer. It is to be understood that the number of deposition steps is only to be limited by the formation of silicon nitride layers with misaligned pinholes.

Following deposition step two, the LPCVD chamber is subjected to a post-purging process with a third ammonia gas in a block 118. By way of example, the third ammonia gas may employ a flow rate ranging from about 100 to about 500 sccm. However, it is to be understood that the present invention may employ any flow rate range for the third ammonia gas that effectively purges the LPCVD chamber.

After the post ammonia purge step, nitrogen gas, such as $N_2$, may be delivered to the LPCVD chamber to purge the system in a block 120. Subsequent to the nitrogen purge, the LPCVD chamber releases the vacuum seal and the system is brought to atmospheric pressure in a block 122. The wafer boat is then unloaded from the LPCVD chamber in a block 124.

FIGS. 2-11 depict a modified process flow for the manufacture of an integrated circuit system, such as an embedded SONOS, in accordance with another embodiment of the present invention. Per this embodiment, the top silicon dioxide layer of a bottom silicon oxide/bottom silicon nitride/top silicon oxide/top silicon nitride (ONON) composition is deposited by high temperature oxidation (HTO). Although, the present embodiment depicts an ONON configuration, HTO of a top silicon dioxide layer in a bottom silicon oxide/silicon nitride/top silicon oxide (ONO) configuration is equally feasible.

Formation of the top silicon oxide layer by HTO promotes passivation of pinholes formed in the bottom silicon nitride layer. By passivating the pinholes with HTO silicon oxide layers, the probability of etching the bottom silicon dioxide layer during a subsequent wet clean step is reduced. Consequently, pitting of the substrate and gate oxide failure are prevented.

It is to be understood that FIGS. 2-11 depict by way of example and not by limitation, an exemplary modified process flow for the formation of an integrated circuit system, such as an embedded SONOS, and it is not to be construed as limiting.

Figure 2:
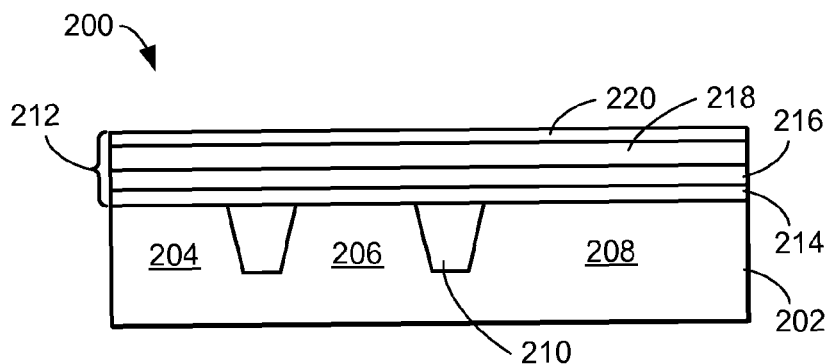
FIG. 2 is an integrated circuit system in accordance with another embodiment of the present invention.

Referring now to FIG. 2, therein is shown an integrated circuit system 200 in accordance with another embodiment of the present invention. The integrated circuit system 200 includes a substrate 202, a core region 204, an input/output (I/O) region 206, a SONOS region 208, STI formations 210, and an ONON layer 212. The ONON layer 212 further includes a bottom silicon oxide layer 214, a bottom silicon nitride layer 216, a top silicon oxide layer 218, and a top silicon nitride layer 220.

The core region 204 may include numerous passive and active devices, or combinations thereof, operating separately or collaboratively. By way of example, the core region 204 may act as a logic circuit to perform various logic functions. The I/O region 206 is separated from the core region 204 and the SONOS region 208 by STI formations 210. The ONON layer 212 is formed over the substrate 202.

Although the present embodiment is about to disclose thickness ranges for the bottom silicon oxide layer 214, the bottom silicon nitride layer 216, the top silicon oxide layer 218, and the top silicon nitride layer 220, it is to be understood that these thickness ranges are merely representative. In accordance with the scope of the invention, the thickness range of each layer is only to be limited by the formation of an effective ONON layer or the prevention of gate oxide failure in the integrated circuit system 200.

The bottom silicon oxide layer 214 may be either grown or deposited over the substrate 202. The bottom silicon oxide layer 214 may be formed to a thickness of between about 20 and 40 angstroms. The bottom silicon nitride layer 216 may be formed to a thickness of between about 30 and 60 angstroms. The top silicon oxide layer 218 may be formed to a thickness of between about 90 and 130 angstroms. The top silicon nitride layer 220 may be formed to a thickness of between about 10 and 30 angstroms. It is to be understood that the bottom silicon nitride layer 216 and the top silicon nitride layer 220 may be formed by multiple separate deposition steps (as disclosed in FIG. 1), which causes microscopic discontinuities (i.e.—pinholes) formed within each layer, to misalign and thereby reduce the incidence of damage to the bottom silicon oxide layer during subsequent etching.

Notably, as mentioned above, the top silicon oxide layer 218 of the ONON layer 212 is formed by HTO. By way of example, a representative HTO process may employ a temperature of about 800° C., a pressure of about 0.36 torr, and DCS and nitrous oxide flow rates of about 30 sccm and 60 sccm, respectively. However, it is to be understood that the present embodiment may employ any temperature range, pressure range, gas combination and flow rate range that will effectively produce a HTO silicon oxide layer, By forming the top silicon oxide layer 218 via a HTO process, defects (e.g.— pinholes) that were formed in the bottom silicon nitride layer 216 during deposition can be passivated. Passivation of these defects can prevent damage to the underlying bottom silicon oxide layer 214 during subsequent etching process steps of the top silicon oxide layer 218 and the bottom silicon nitride layer 216. Prevention of damage to the underlying bottom silicon oxide layer 214 during etching helps to eliminate silicon pitting of the substrate 202, which is believed to be a cause of gate oxide failure in devices formed over the core region 204 and the I/O region 206.

Figure 3:
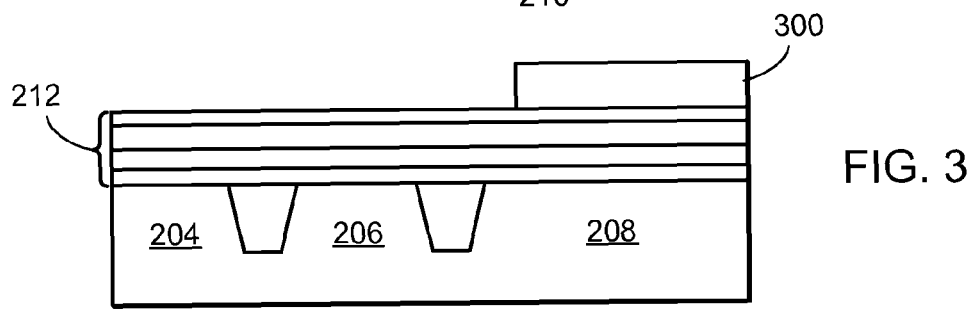
FIG. 3 is the structure of FIG. 2 after the formation of an etch mask.

Referring now to FIG. 3, therein is shown the structure of FIG. 2 after the formation of an etch mask 300. The etch mask 300, such as a first etch mask, is formed over the SONOS region 208 so that the ONON layer 212 formed over the core region 204 and the I/O region 206 may be removed. The etch mask 300 composition and techniques using it are well known in the art and are not repeated herein.

Figure 4:
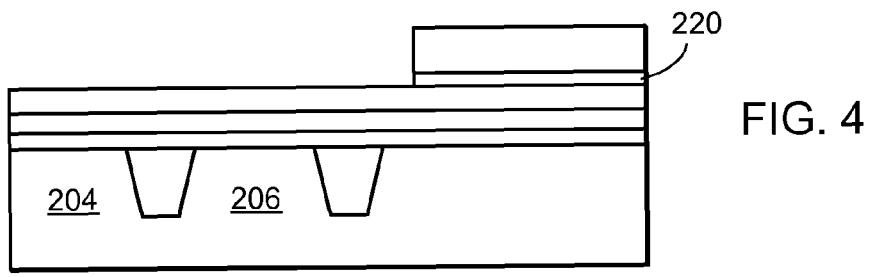
FIG. 4 is the structure of FIG. 3 after the top silicon nitride layer is removed.

Referring now to FIG. 4, therein is shown the structure of FIG. 3 after the top silicon nitride layer 220 is removed. The top silicon nitride layer 220 is removed from over the core region 204 and the I/O region 206 by techniques well known within the art, such as dry-etching.

Figure 5:
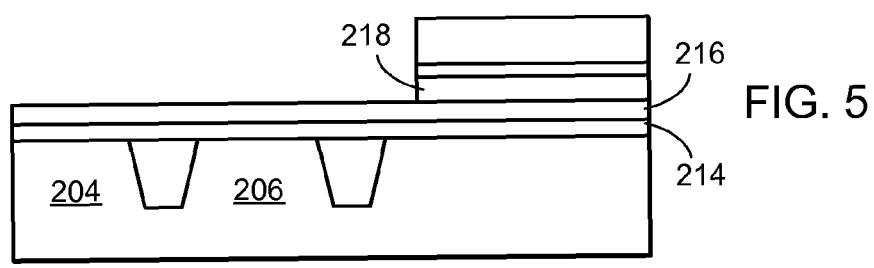
FIG. 5 is the structure of FIG. 4 after the top silicon oxide layer is removed.

Referring now to FIG. 5, therein is shown the structure of FIG. 4 after the top silicon oxide layer 218 is removed. The top silicon oxide layer 218 is removed from over the core region 204 and the I/O region 206 by techniques well known within the art, such as a wet clean. For example, the wet clean process may employ a Standard Clean-1 step followed by a dilute hydrofluoric acid clean step where the ratio is 100:1.

Notably, the passivation of the bottom silicon nitride layer 216 by HTO of the top silicon oxide layer 218 mends any defects within the bottom silicon nitride layer 216 that might provide micro-channels for the dispersion of etchant species to attack the bottom silicon oxide layer 214.

Figure 6:
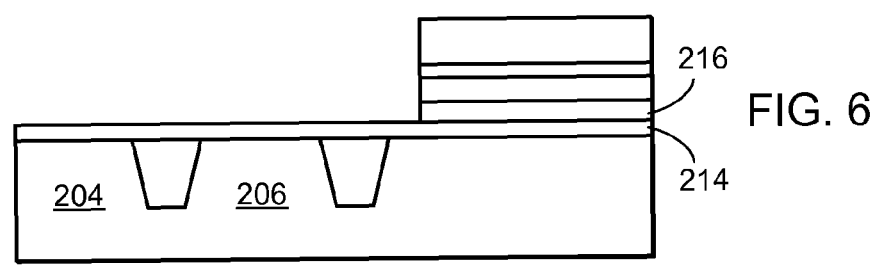
FIG. 6 is the structure of FIG. 5 after the bottom silicon nitride layer is removed.

Referring now to FIG. 6, therein is shown the structure of FIG. 5 after the bottom silicon nitride layer 216 is removed. The bottom silicon nitride layer 216 is removed from over the core region 204 and the I/O region 206 by techniques well known within the art, such as dry-etching. Notably, the bottom silicon oxide layer 214 exhibits little damage due to the preceding etch steps.

Figure 7:
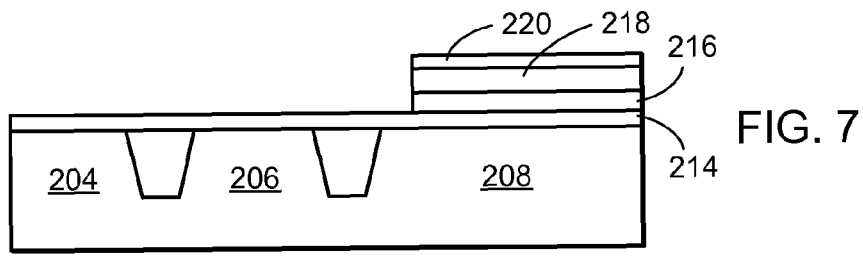
FIG. 7 is the structure of FIG. 6 after the etch mask is removed.

Referring now to FIG. 7, therein is shown the structure of FIG. 6 after the etch mask 300, of FIG. 3, is removed. By way of example, the etch mask 300 can be removed by a Physical Resist Strip (PRS) process and/or a Chemical Resist Strip (CRS) process. The PRS process employs a plasma chemistry to remove the etch mask 300 and the CRS process employs a sulfuric acid/hydrogen peroxide mixture followed by a Standard Clean-1 process.

At this intermediate stage, the bottom silicon oxide layer 214, the bottom silicon nitride layer 216, the top silicon oxide layer 218, and the top silicon nitride layer 220 remain intact over the SONOS region 208 and only the bottom silicon oxide layer 214 remains intact over the core region 204 and the I/O region 206.

Figure 8:
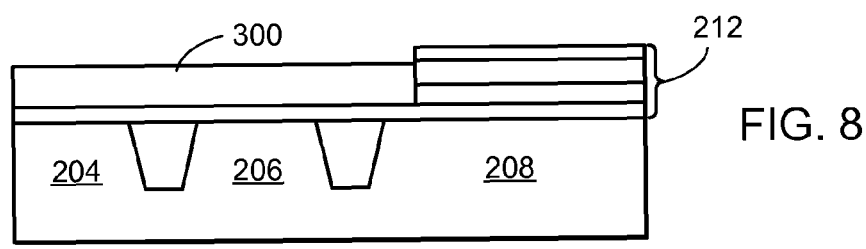
FIG. 8 is the structure of FIG. 7 after the formation of an etch mask.

Referring now to FIG. 8, therein is shown the structure of FIG. 7 after the formation of an etch mask 300. The etch mask 300, such as a second etch mask, is formed over the core region 204 and the I/O region 206 so that the ONON layer 212 above the SONOS region 208 may be etched. The etch mask 300 composition and techniques using it are well known in the art and are not repeated herein.

Figure 9:
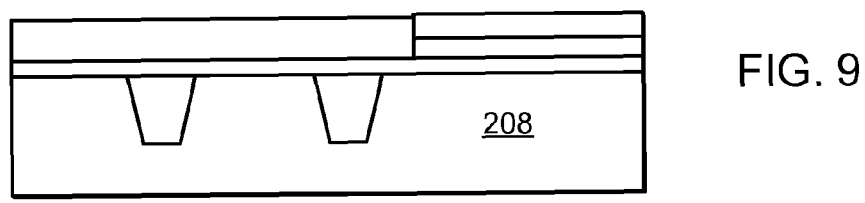
FIG. 9 is the structure of FIG. 8 after the top silicon nitride layer is removed from over the SONOS region.

Referring now to FIG. 9, therein is shown the structure of FIG. 8 after the top silicon nitride layer 220, of FIG. 7, is removed from over the SONOS region 208. The top silicon nitride layer 220 may be removed by a nitride dry etch with a high selectivity to oxide material.

Figure 10:
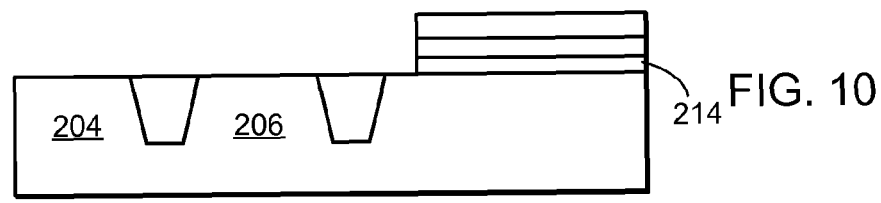
FIG. 10 is the structure of FIG. 9 after the etch mask and the bottom silicon oxide layer are removed.

Referring now to FIG. 10, therein is shown the structure of FIG. 9 after the etch mask 300, of FIG. 8, and the bottom silicon oxide layer 214 are removed. The etch mask 300 and the bottom silicon oxide layer 214 are removed from over the core region 204 and the I/O region 206. By way of example and not by way of limitation, the etch mask 300 can be removed by the CRS and/or PRS process described above, and the bottom silicon oxide layer 214 can be removed by a conventional cleaning process called an RCA clean (named after the developer RCA) employing diluted hydrofluoric acid (DHF).

Figure 11:
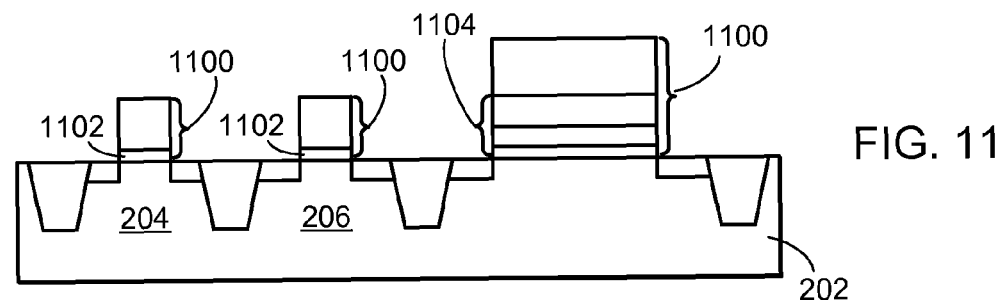
FIG. 11 is the structure of FIG. 10 after formation of gate structures.

Referring now to FIG. 11, therein is shown the structure of FIG. 10 after formation of gate structures 1100. Gate structures 1100 may include gate oxides 1102 or a gate ONO structure 1104. Importantly, the gate oxides 1102 are formed without defects, such as holes, due to the absence of silicon pitting of the substrate 202. By improving the integrity of the gate oxides 1102, the gate structures 1100 formed over the core region 204 and the I/O region 206 experience decreased failure rates.

FIGS. 12-18 depict a process flow employing a hot phosphoric acid treatment of an integrated circuit system, such as embedded SONOS, in accordance with another embodiment of the present invention. Per the present embodiment, a hot phosphoric acid treatment is employed to remove a silicon nitride layer formed over a lower silicon oxide layer. Notably, the hot phosphoric acid etch of the silicon nitride layer will not cause silicon pitting of the substrate.

It is to be understood that FIGS. 12-18 depict by way of example and not by limitation, an exemplary process flow employing a hot phosphoric acid treatment of an integrated circuit system, such as an embedded SONOS, and it is not to be construed as limiting.

Figure 12:
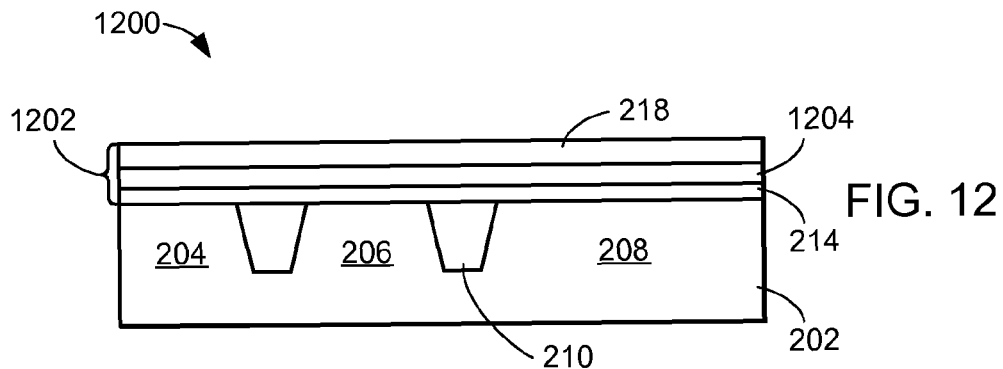
FIG. 12 is an integrated circuit system in accordance with another embodiment of the present invention.

Referring now to FIG. 12, therein is shown an integrated circuit system 1200 in accordance with another embodiment of the present invention. The integrated circuit system 1200 includes the substrate 202, the core region 204, the input/output (I/O) region 206, the SONOS region 208, STI formations 210, and an ONO layer 1202. The ONO layer 1202 further includes a bottom silicon oxide layer 214, a silicon nitride layer 1204, and a top silicon oxide layer 218.

The core region 204 may include numerous passive and active devices, or combinations thereof, operating separately or collaboratively. By way of example, the core region 204 may act as a logic circuit to perform various logic functions. The I/O region 206 is separated from the core region 204 and the SONOS region 208 by STI formations 210. The ONO layer 1202 is formed over the substrate 202.

Although the present embodiment is about to disclose thickness ranges for the bottom silicon oxide layer 214, the silicon nitride layer 1204, and the top silicon oxide layer 218, it is to be understood that these thickness ranges are merely representative. In accordance with the scope of the invention, the thickness range of each layer is only to be limited by the formation of an effective ONO layer or the prevention of gate oxide failure in the integrated circuit system 1200.

The bottom silicon oxide layer 214 may be either grown or deposited over the substrate 202. The bottom silicon oxide layer 214 may be formed to a thickness of between about 20 and 40 angstroms. The silicon nitride layer 1204 may be formed to a thickness of between about 30 and 60 angstroms. Additionally, it is to be understood that the silicon nitride layer 1204 can be formed by multiple separate deposition steps (as disclosed in FIG. 1), which causes microscopic discontinuities (i.e.—pinholes) formed within each layer, to misalign and thereby reduce the incidence of damage to the bottom silicon oxide layer 214 during subsequent etching. The top silicon oxide layer 218 may be either grown or deposited to a thickness of between about 110 and 150 angstroms.

Figure 13:
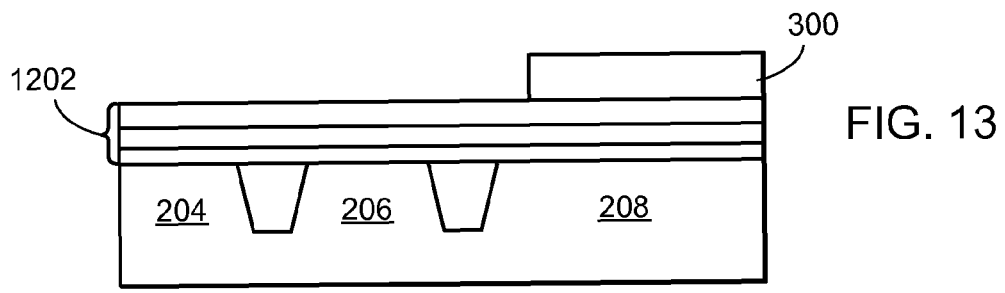
FIG. 13 is the structure of FIG. 12 after the formation of an etch mask.

Referring now to FIG. 13, therein is shown the structure of FIG. 12 after the formation of an etch mask 300. Etch mask 300 is formed over the SONOS region 208 so that the ONO layer 1202 formed over the core region 204 and the I/O region 206 may be removed. The etch mask 300 composition and techniques using it are well known in the art and are not repeated herein.

Figure 14:
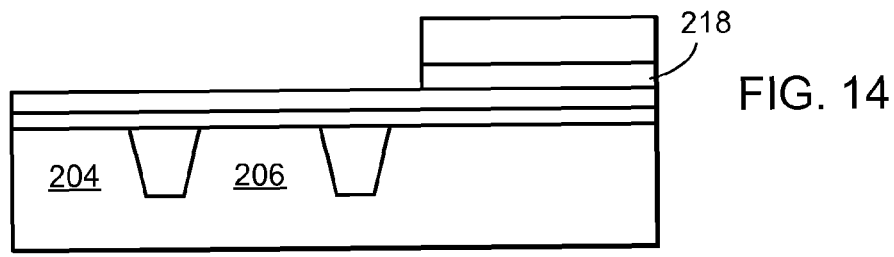
FIG. 14 is the structure of FIG. 13 after the top silicon oxide layer is removed.

Referring now to FIG. 14, therein is shown the structure of FIG. 13 after the top silicon oxide layer 218 is removed. The top silicon oxide layer 218 is removed from over the core region 204 and the I/O region 206 by techniques well known within the art, such as dry-etching followed by a wet clean.

Figure 15:
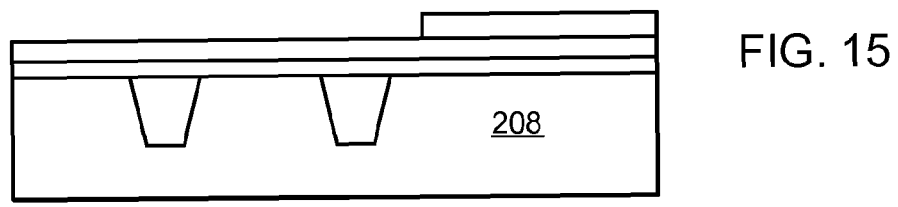
FIG. 15 is the structure of FIG. 14 after the etch mask is removed.

Referring now to FIG. 15, therein is shown the structure of FIG. 14 after the etch mask 300, of FIG. 13, is removed from over the SONOS region 208. By way of example, the etch mask 300 may be removed by PRS and/or CRS process steps.

Figure 16:
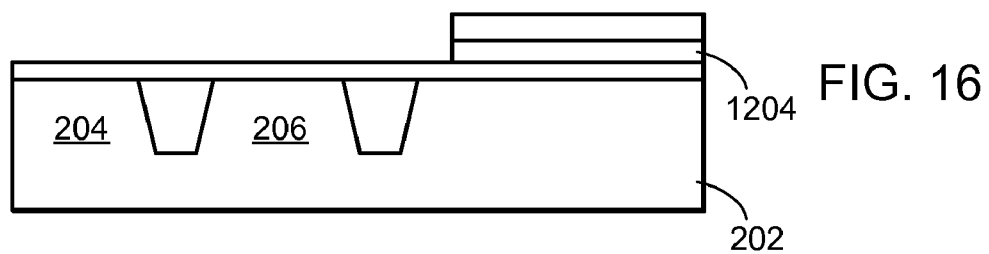
FIG. 16 is the structure of FIG. 15 after the removal of the silicon nitride layer.

Referring now to FIG. 16, therein is shown the structure of FIG. 15 after the removal of the silicon nitride layer 1204. The silicon nitride layer 1204 is removed from over the core region 204 and the I/O region 206 by a hot phosphoric acid etch treatment. By way of example, the hot phosphoric acid treatment may employ about 55 to about 85 percent phosphoric acid by volume. However, it is to be understood that the present invention may employ any volume percentage of phosphoric acid that will efficiently remove the silicon nitride layer 1204.

As mentioned above, the hot phosphoric acid etch treatment will not cause silicon pitting of the substrate 202. Consequently, the likelihood of gate dielectric failure due to silicon pitting is reduced.

Figure 17:
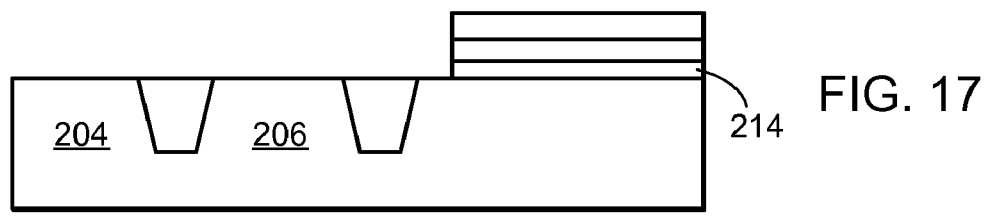
FIG. 17 is the structure of FIG. 16 after the removal of the bottom silicon oxide layer.

Referring now to FIG. 17, therein is shown the structure of FIG. 16 after the removal of the bottom silicon oxide layer 214. The bottom silicon oxide layer 214 is removed from over the core region 204 and the I/O region 206 by a pre-clean process. By way of example, the pre-clean process may employ a Standard Clean-1 step followed by a dilute hydrofluoric acid step with a ratio of 100:1.

Figure 18:
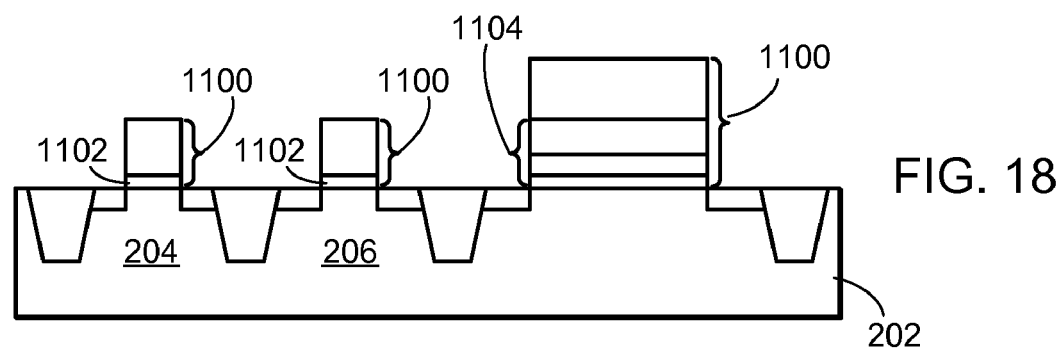
FIG. 18 is the structure of FIG. 17 after formation of gate structures.

Referring now to FIG. 18, therein is shown the structure of FIG. 17 after formation of gate structures 1100. Gate structures 1100 may include gate oxides 1102 or a gate ONO structure 1104. Importantly, the gate oxides 1102 are formed without defects, such as holes, due to the absence of silicon pitting of the substrate 202. By improving the integrity of the gate oxides 1102, the gate structures 1100 formed over the core region 204 and the I/O region 206 experience decreased failure rates.

Figure 19:
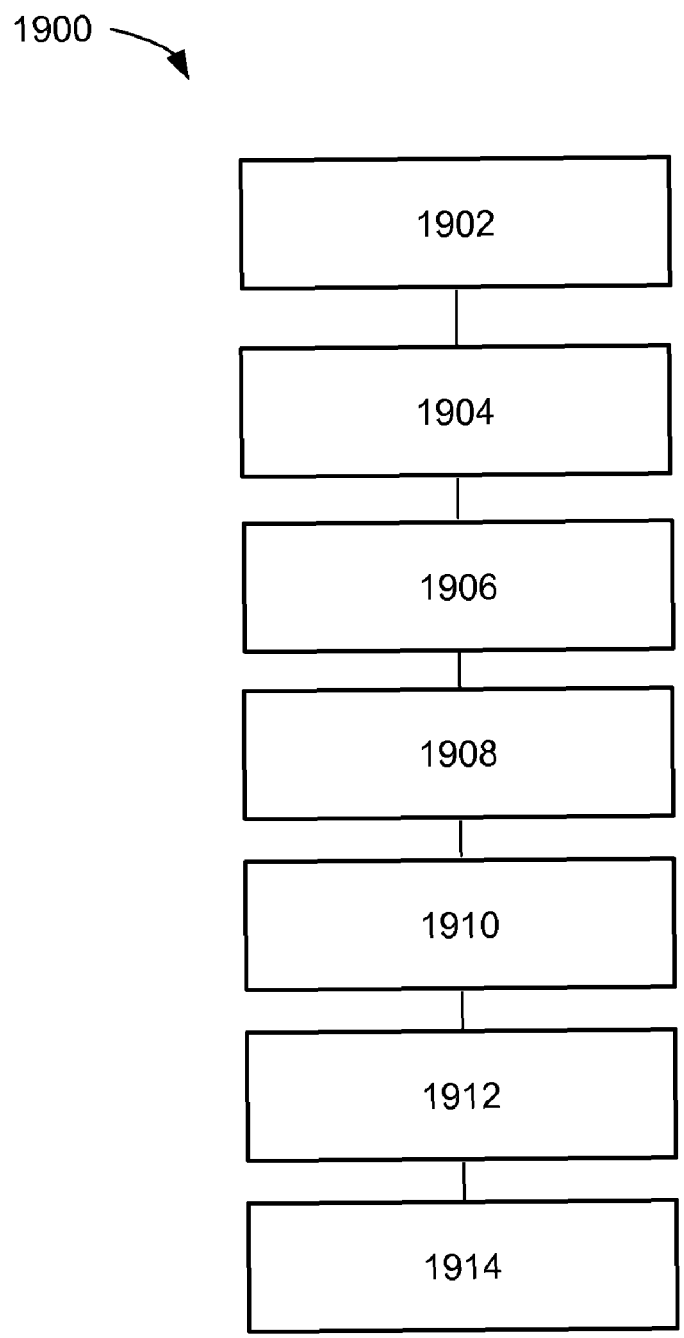
FIG. 19 is a flow chart for an integrated circuit system for fabricating the integrated circuit system in accordance with an embodiment of the present invention.

Referring now to FIG. 19, therein is shown a flow chart for an integrated circuit system 1900 for fabricating the integrated circuit system 100 in accordance with an embodiment of the present invention. The integrated circuit system 1900 includes loading a wafer into a processing chamber in a block 1902; pre-purging the processing chamber with a first ammonia gas in a block 1904; depositing a first nitride layer over the wafer in a block 1906; purging the processing chamber with a second ammonia gas in a block 1908; depositing a second nitride layer over the first nitride layer that is misaligned with the first nitride layer in a block 1910; post-purging the processing chamber with a third ammonia gas in a block 1912; and purging the processing chamber with a nitrogen gas in a block 1914.

Figure 20:
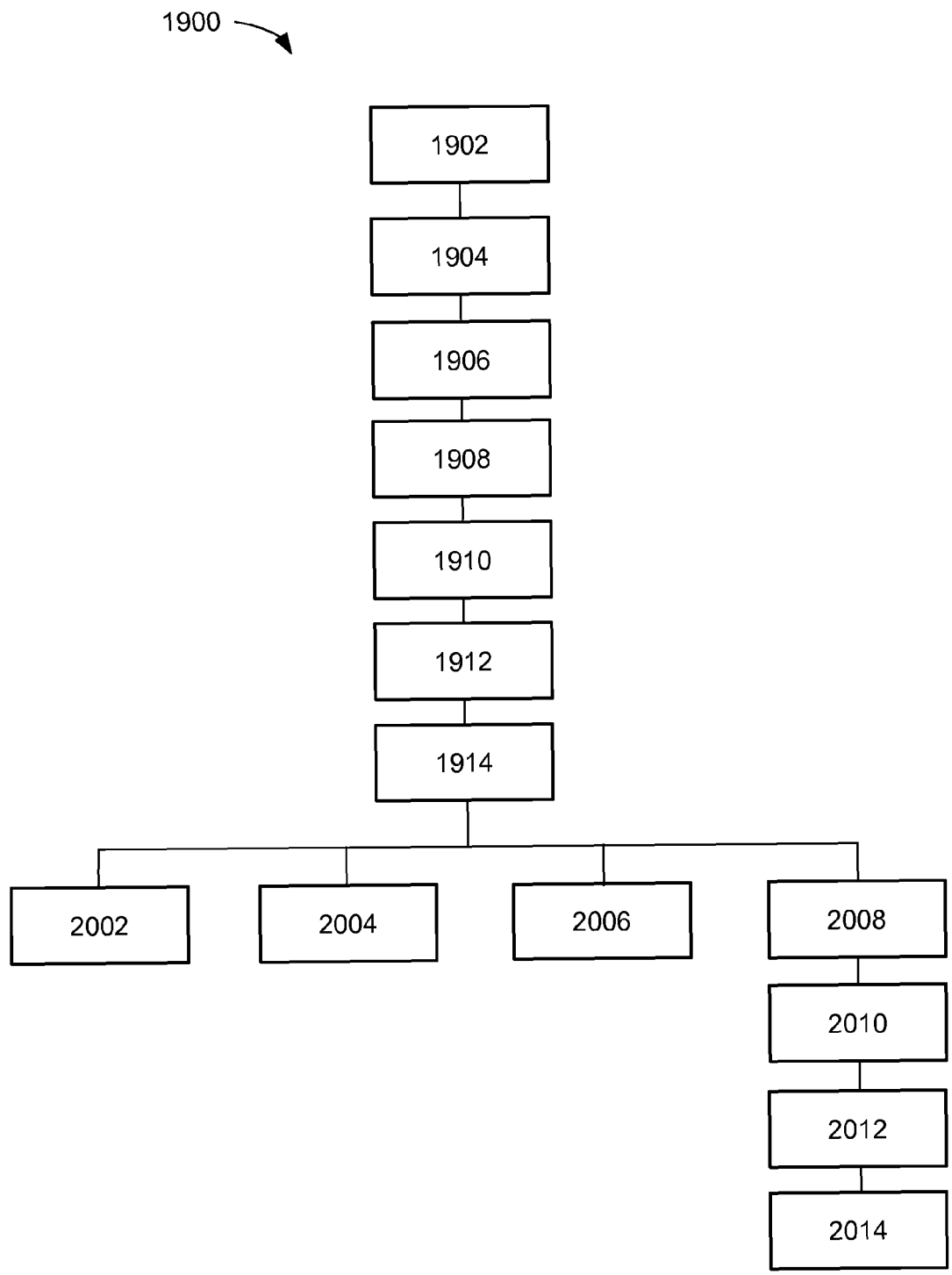
FIG. 20 is a flow chart for the integrated circuit system for fabricating the integrated circuit system in accordance with additional embodiments of the present invention.

Referring now to FIG. 20, therein is shown a flow chart for the integrated circuit system 1900 for fabricating the integrated circuit system 100 in accordance with additional embodiments of the present invention. The integrated circuit system 1900 includes loading a wafer into a processing chamber in a block 1902; pre-purging the processing chamber with a first ammonia gas in a block 1904; depositing a first nitride layer over the wafer in a block 1906; purging the processing chamber with a second ammonia gas in a block 1908; depositing a second nitride layer over the first nitride layer that is misaligned with the first nitride layer in a block 1910; post-purging the processing chamber with a third ammonia gas in a block 1912; and purging the processing chamber with a nitrogen gas in a block 1914.

Additionally, the integrated circuit system 1900 may include configuring the first nitride layer and the second nitride layer as part of an ONO configuration in a block 2002.

Further, the integrated circuit system 1900 may include configuring the first nitride layer and the second nitride layer as part of each nitride layer of an ONON configuration in a block 2004.

Additionally, the integrated circuit system 1900 may include depositing additional misaligned nitride layers over the second nitride layer in a block 2006.

Furthermore, the integrated circuit system 1900 may include pumping down the processing chamber in a block 2008; ramping up first source gases to deposit the first nitride layer in a block 2010; ramping up second source gases to deposit the second nitride layer in a block 2012; and depositing additional misaligned nitride layers over the second nitride layer in a block 2014.

It has been discovered that the present invention thus has numerous aspects. A principle aspect is that an embodiment of the present invention teaches forming a silicon nitride layer by multiple separate deposition steps, which may cause microscopic discontinuities formed within each layer to misalign. By misaligning the discontinuities, silicon pitting of the substrate caused by subsequent etching can be prevented and the incidence of gate oxide failure can be reduced.

Another aspect of an embodiment of the present invention is that by forming the top silicon oxide layer of an ONON structure via HTO, the bottom silicon nitride layer is passivated and the bottom silicon oxide layer is protected from subsequent etching steps. By preventing damage to the bottom silicon oxide layer, silicon pitting of the substrate can be prevented and gate oxide integrity is improved.

Another aspect of an embodiment of the present invention is that hot phosphoric acid etching of a silicon nitride layer in an ONO configuration will not cause silicon pitting of a substrate. By employing hot phosphoric acid etching of a silicon nitride layer in an ONO configuration, gate oxide integrity can be improved.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects. For instance, by forming a silicon nitride layer by multiple separate deposition steps, by employing HTO of a silicon oxide layer formed over a silicon nitride layer, or etching a silicon nitride layer by hot phosphoric acid, damage to an underlying substrate can be prevented. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. An integrated circuit method for manufacturing an integrated circuit system comprising:
loading a wafer having a bottom silicon oxide layer thereover into a processing chamber;
pre-purging the processing chamber before depositing a nitride layer with only a first ammonia gas;
depositing a first nitride layer over the bottom silicon oxide layer and the wafer utilizing first source gases;
purging the processing chamber with a second ammonia gas;
depositing a second nitride layer directly on the first nitride layer that is misaligned with the first nitride layer by utilizing second source gases that are the same as the first source gases;
post-purging the processing chamber with a third ammonia gas;
purging the processing chamber with a nitrogen gas; and
etching the first nitride layer and the second nitride layer without substantial damage to the bottom silicon oxide layer due to the misalignment of the first nitride layer and the second nitride layer.

2. The method as claimed in claim 1 wherein:
loading the wafer includes loading a plurality of wafers.

3. The method as claimed in claim 1 wherein:
loading the wafer into the processing chamber includes loading the wafer into a low pressure chemical vapor deposition chamber.

4. The method as claimed in claim 1 further comprising:
configuring the first nitride layer and the second nitride layer as part of an ONO configuration.

5. The method as claimed in claim 1 further comprising:
configuring the first nitride layer and the second nitride layer as part of each nitride layer of an ONON configuration.

6. The method as claimed in claim 1 wherein:
depositing the first nitride layer and the second nitride layer prevents damage of the wafer during subsequent etching of an overlying layer.

7. The method as claimed in claim 1 further comprising:
depositing additional misaligned nitride layers over the second nitride layer.

8. The method as claimed in claim 1 further comprising:
pumping down the processing chamber;
ramping up the first source gases to deposit the first nitride layer; and
ramping up the second source gases to deposit the second nitride layer.

9. The method as claimed in claim 8 wherein:
ramping up the first source gases and the second source gases includes ramping up dichlorosilane and ammonia.

10. The method as claimed in claim 8 further comprising:
depositing additional misaligned nitride layers over the second nitride layer.

\* \* \* \* \*